(12) United States Patent
Meng et al.

(10) Patent No.: US 12,069,812 B2
(45) Date of Patent: Aug. 20, 2024

(54) HOUSING FOR MULTIFUNCTIONAL ELECTRONIC DEVICE AND METHOD FOR PREPARING THE SAME

(71) Applicant: Covestro Deutschland AG, Leverkusen (DE)

(72) Inventors: Jiru Meng, Shanghai (CN); Meiying Zhu, Shanghai (CN); Guanghui Wu, Shanghai (CN)

(73) Assignee: Covestro Deutschland AG, Leverkusen (DE)

( * ) Notice: Subject to any disclaimer, the term of this patent is extended or adjusted under 35 U.S.C. 154(b) by 0 days.

(21) Appl. No.: 18/259,288

(22) PCT Filed: Dec. 29, 2021

(86) PCT No.: PCT/EP2021/087762
§ 371 (c)(1),
(2) Date: Jun. 26, 2023

(87) PCT Pub. No.: WO2022/152561
PCT Pub. Date: Jul. 21, 2022

(65) Prior Publication Data
US 2023/0397344 A1    Dec. 7, 2023

(30) Foreign Application Priority Data

Jan. 14, 2021  (CN) .......................... 202110047998.0
Jan. 29, 2021  (EP) ..................................... 21154162

(51) Int. Cl.
*H05K 5/00*    (2006.01)
*H05K 7/20*    (2006.01)

(52) U.S. Cl.
CPC ......... *H05K 5/0004* (2013.01); *H05K 7/2039* (2013.01)

(58) Field of Classification Search
CPC .. H05K 5/0004; H05K 7/2039; H05K 5/0217; H05K 5/03; H05K 5/0013; H05K 1/095; H05K 3/10; H05K 2201/0108
See application file for complete search history.

(56) References Cited

U.S. PATENT DOCUMENTS

2009/0189817 A1* 7/2009 Yang ........................ H01Q 1/40
                                                                    204/192.15
2011/0188179 A1* 8/2011 Myers ................... G06F 1/1656
                                                                    361/679.01

(Continued)

FOREIGN PATENT DOCUMENTS

CN      103140064 A     6/2013
CN      109275308 A     1/2019

(Continued)

OTHER PUBLICATIONS

International Search Report, PCT/EP2021/087762, date of mailing: Apr. 4, 2022, Authorized officer: J. Beaudet.

*Primary Examiner* — Adam B Dravininkas
(74) *Attorney, Agent, or Firm* — John E. Mrozinski, Jr.

(57) ABSTRACT

The present invention relates to a housing for a multifunctional electronic device and a method for preparing the same. The housing comprises an upper cover and a lower cover fixed together to form an internal space, wherein the upper cover comprises a first layer formed of a first thermoplastic material, said first layer having a thickness in the range of 0.8 mm to 1.5 mm and comprising at least two functional components integrated thereon; the lower cover comprises a second layer formed of a second thermoplastic material, said second layer having a thickness in the range of 2 mm to 4 mm; and the housing for the multifunctional electronic device comprises at least 90 wt % of the thermoplastic materials, relative to the total weight of the housing.

15 Claims, 3 Drawing Sheets

A                                                                B

(56) References Cited

U.S. PATENT DOCUMENTS

| | | | |
|---|---|---|---|
| 2014/0016996 A1* | 1/2014 | Chung | H05K 5/0013 403/321 |
| 2014/0262848 A1* | 9/2014 | Fathollahi | H05K 5/03 206/37 |
| 2018/0052491 A1* | 2/2018 | Kapinos | G06F 1/18 |

FOREIGN PATENT DOCUMENTS

| EP | 2086049 A1 | 8/2009 |
|---|---|---|
| KR | 20130115192 A | 10/2013 |

\* cited by examiner

A  B

A    B

A    B

A  B

A  B

HOUSING FOR MULTIFUNCTIONAL ELECTRONIC DEVICE AND METHOD FOR PREPARING THE SAME

CROSS REFERENCE TO RELATED APPLICATIONS

This application is a national stage application under 35 U.S.C. § 371 of PCT/EP2021/087762, filed Dec. 29, 2021, which claims benefit of CN Application No. 202110047998.0, filed Jan. 14, 2021, and EP Application No. 21154162.8, filed Jan. 29, 2021, all of which are incorporated herein by reference in their entireties.

TECHNICAL FIELD

The present invention belongs to the field of design and processing of electronic devices. In particular, the present invention relates to a housing for a multifunctional electronic device and a method for preparing the same.

BACKGROUND ART

Advances in science and technology drive an increasing number of electronic products to be present in the form of mobile terminals, and these electronic products are also becoming more intelligent, integrated and functional.

Nowadays portable electronic devices need to integrate multiple functions. Such multi-functional integrated design brings users more convenience, and at the same time power consumption of electronic and electrical products increases. On the other hand, the electronic and electrical products are to be designed lighter and thinner, which poses an enormous challenge to heat dissipation thereof.

Moreover, with the advent of 5G technology, the Internet of Things becomes inevitable. Electronic and electrical products need to have excellent and stable signal transmission performance. With the Internet of Things, the electronic and electrical products will not only provide functions meeting personalized requirements, but also seamlessly connect with every aspect of life. For example, the products need to be compatible with the environment, and have a modular design to meet individual requirements. These all place higher demands on the design and material selection of the electronic and electrical products, i.e. make the products slim, small and meeting diversified requirements.

EP 2 086 049 A1 discloses a housing for a wireless communication device, which includes a decorative film, an antenna pattern formed on the decorative film, and a substrate moldingly attached to the decorative film and the antenna pattern. The antenna is made of a metal coating. The antenna pattern is sandwiched between the decorative film and the substrate.

KR 2013 0115192 A discloses an antenna integrated mobile device case and a manufacturing method thereof to minimize the radio frequency (RF) characteristic degradation of a mobile device by setting free implementation of the texture and pattern of a black-and-white or color material.

CN 109 275 308 A relates to a heat dissipation coating structure of a casing of a portable electronic device, comprising: a front casing or a rear casing suitable for the portable electronic device, wherein a high heat dissipation material is transferred on an unformed plasticized plate to form a printing plate with a heat dissipation coating.

US 2014/016996 A1 discloses a latching structure for portable electric device with a first housing and a second housing, comprising a latching groove defined the first housing, a removable portion formed in the latching groove; a hook located on the second housing, the hook latching with the latching groove; wherein the removable portion is separated from the first housing to expose the latching groove for pushing the hook out of the latching groove.

In view of the prior technical solution of products, the integrated design of WiFi, wireless charging and other electronic functions has the following technical barriers:

1) Electromagnetic interference renders various functions instable and unreliable, and the conventional way for avoiding electromagnetic inference is to increase spatial distance or add additional electromagnetic shielding components. These solutions undoubtedly limit to a large extent the freedom of design of the products, increase the cost, and run counter to the trend of a slim design.

2) Under a slim design, the heat dissipation problem cannot be effectively solved. Most of the existing heat dissipation solutions involve using metal to dissipate heat, which could hardly realize a slim design. The prior art also includes technologies using plastics with high thermal conductivity for heat dissipation. However, plastics with high thermal conductivity are quite brittle and have undesirable appearance performance, failing to meet the structural strength and aesthetic requirements in product processing and use.

CN103140064A discloses a method for designing a housing and an electronic device including the housing. The housing is arranged to be composed of a structural layer of a non-thermally conductive material located on the outer layer and a thermally conductive layer located on the inner side that facilitates heat dissipation, wherein the structural layer and the thermally conductive layer are laminated. Such design improves the heat dissipation effect of the electronic device housing, thus increasing the reliability of the product and extending the shelf life of the product. However, the electronic device does not integrate electronic functions such as WiFi and wireless charging.

Furthermore, sustainable development and circular economy are now trending topics in various industries, and under the requirements and guidance of national policies of various countries, they put forward higher requirements on various industries. For example, China has set the goal of achieving carbon neutrality by 2060. The electrical and electronic industry, as one of the four major industries demanding raw materials, is vital to global sustainable development and circular economy. In 2019, only 17.4% of the global e-waste was recycled, which is still far behind from the sustainable development goal set by countries.

The existing housing for multifunctional integrated electronic devices cannot meet various technical requirements such as heat dissipation performance, good signal transmission, and the like. In addition, the current design of the electronic device housing remains challenging for recycling of electronic devices.

Therefore, it is imperative to develop a housing for an integrated electronic and electrical device that meets the requirements of basic performance and sustainable development at the same time.

SUMMARY OF THE INVENTION

One objective of the present invention is to provide an electronic device housing that integrates multiple functional components and has good heat dissipation performance and signal transmission performance.

Another objective of the present invention is to provide an electronic device housing that meets the requirements of sustainable development.

Yet another objective of the present invention is to provide a method for preparing the above electronic device housing.

Thus, according to a first aspect, the present invention provides a housing for a multifunctional electronic device, comprising:

- an upper cover comprising a first layer formed of a first thermoplastic material with an in-plane thermal conductivity of less than 1.5 W/(m·K), a relative dielectric constant (Dk) of less than 5.0 and a surface resistance of greater than $10^{11}\Omega$, wherein the first layer has a thickness in the range of 0.8 mm to 1.5 mm, and wherein at least two functional components are integrated to the first layer; and
- a lower cover, which is fixed together with the upper cover to form an internal space, comprising a second layer formed of a second thermoplastic material with an in-plane thermal conductivity in the range of 0.25 W/(m·K) to 1.5 W/(m·K), wherein the second layer has a thickness in the range of 2 mm to 4 mm;

wherein the housing comprises at least 90 wt % of the thermoplastic materials, relative to the total weight of the housing, the upper cover has a flame retardant rating of HB or above, as determined according to UL94-2015, the in-plane thermal conductivity is determined according to ASTM1461-01(2001), the relative dielectric constant is determined according to IEC61189-2-721:2015 with the SPDR (split postdielectric resonator) method at a frequency of 5.0 GHz, the surface resistance is determined according to ISO3915-1999.

According to a second aspect, the present invention provides a method for preparing the above housing, comprising:

i) forming the upper cover comprising the first layer and an optional decorative layer, and integrating the functional components to the first layer;

ii) forming the lower cover comprising the second layer and an optional heat dissipator; and iii) optionally, fixing the upper cover together with the lower cover to form an internal space.

According to a third aspect, the present invention provides a multifunctional electronic device comprising the above housing.

Through the thin-layer design of the upper cover and the material selection of the upper and lower covers, the housing for a multifunctional electronic device of the present invention achieves desirable heat dissipation performance and signal transmission performance. Meanwhile, the housing for a multifunctional electronic device of the present invention has at least two functional components integrated to the upper cover, thus making the electronic device both small and slim. In addition, since at least 90 wt % of the constituent materials of the electronic device housing of the present invention are thermoplastic materials, it would be much easier to recycle the materials than the solution using a lower cover of metal for heat dissipation, and would consume less energy for recycling.

BRIEF DESCRIPTION OF THE DRAWINGS

The present invention will be described and explained in detail in conjunction with the drawings hereinafter. The same reference number represents the same element in the drawings.

DETAILED DESCRIPTION OF THE INVENTION

Figure 1:
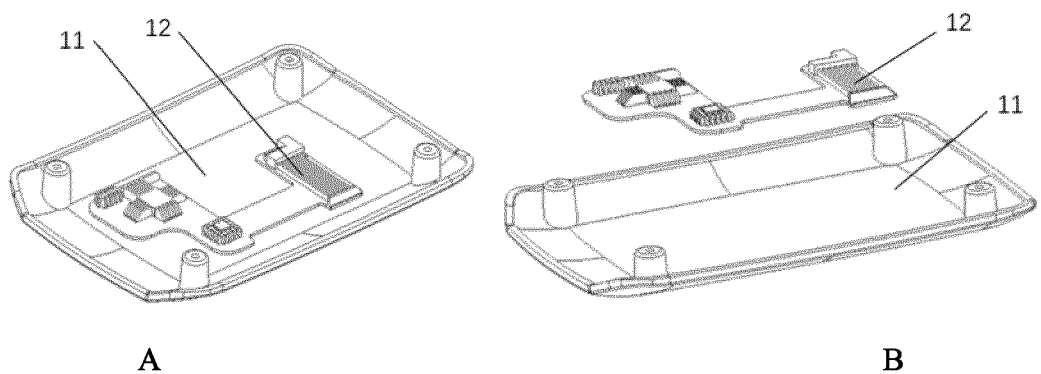
FIG. 1 shows a schematic diagram of the lower cover of the housing for a multifunctional electronic device according to an embodiment of the present invention, wherein A is an overall view, B is an exploded view, 11 represents a second layer, and 12 represents a heat dissipator.

Some embodiments of the present invention will be non-restrictively illustrated in conjunction with the drawings hereinafter.

According to the first aspect, the present invention provides a housing for a multifunctional electronic device, comprising:

an upper cover comprising a first layer formed of a first thermoplastic material with an in-plane thermal conductivity of less than 1.5 W/(m·K), a relative dielectric constant (Dk) of less than 5.0 and a surface resistance of greater than $10^{11}\Omega$, wherein the first layer has a thickness in the range of 0.8 mm to 1.5 mm, and wherein at least two functional components are integrated to the first layer; and a lower cover, which is fixed together with the upper cover to form an internal space, comprising a second layer formed of a second thermoplastic material with an in-plane thermal conductivity in the range of 0.25 W/(m·K) to 1.5 W/(m·K), wherein the second layer has a thickness in the range of 2 mm to 4 mm;

wherein the housing comprises at least 90 wt % of the thermoplastic materials, relative to the total weight of the housing;

the upper cover has a flame retardant rating of HB or above, as determined according to UL94-2015, the in-plane thermal conductivity is determined according to ASTM1461-01(2001), the relative dielectric constant is determined according to IEC61189-2-721:2015 with the SPDR (split postdielectric resonator) method at a frequency of 5.0 GHz, the surface resistance is determined according to ISO3915-1999.

Preferably, the upper cover further comprises a decorative layer disposed on the outer surface of the first layer and at least partially covering the first layer, wherein the decorative layer is formed of a third thermoplastic material with an in-plane thermal conductivity of less than 0.25 W/(m·K), relative dielectric constant (Dk) of less than 5.0 and surface resistance of greater than $10^{11}\Omega$, and has a thickness in the range of 0.8 mm to 1.2 mm, wherein the in-plane thermal conductivity is determined according to ASTM1461-01 (2001), the relative dielectric constant is determined according to IEC61189-2-721:2015 with the SPDR (split postdielectric resonator) method at a frequency of 5.0 GHz, the surface resistance is determined according to ISO3915-1999.

In the present application, the term "inner surface" refers to the surface facing the internal space of the electronic device.

In the present application, the term "outer surface" refers to the surface facing the outside environment of the electronic device.

The thermoplastic material for forming the first layer and the decorative layer may be polycarbonate or a polycarbonate/acrylonitrile-butadiene-styrene (PC/ABS) blend, for example, Makrolon® or Bayblend® products commercially available from the company Covestro Polymer (China).

As a thermoplastic material for forming the first layer and the decorative layer, mention can be made of polycarbonate sold by the company Covestro Polymer (China) under the trade name of Makrolon® FR6005HF, Makrolon® FR6005R50, or Bayblend® FR3040 W.

The thermoplastic material for forming the first layer and the decorative layer has strong signal penetration capability to meet signal transmission requirements of electronic elements such as WiFi and wireless charging and the like. The housing for a multifunctional electronic device according to the present invention has a signal penetration ratio of above 95%.

Preferably, the thermoplastic material for forming the first layer and the decorative layer has excellent flame retardant properties (for example, when determined according to UL94-2015, it can reach a flame retardant rating of V0 at a thickness of 0.8 mm to 1.5 mm) to ensure safety of the multifunctional electronic device under the circumstance of high energy consumption and high heat generation.

The first layer and the decorative layer may be formed of the same or different materials.

The decorative layer may have a decorative texture.

The first layer and the decorative layer may be integrally formed or separately formed and then assembled together.

The thermoplastic material for forming the second layer may be polycarbonate, for example, Makrolon® products commercially available from the company Covestro Polymer (China).

As a thermoplastic material for forming the second layer, mention can be made of polycarbonate sold by the company Covestro Polymer (China) under the trade name of Makrolon® TC110FR.

Preferably, the lower cover further comprises a heat dissipator disposed on the inner surface of the second layer and at least partially covering the second layer.

The heat dissipator covers at most 80% of the inner surface area of the second layer.

The heat dissipator may be configured as a heat dissipating rib, a heat dissipating block or a heat dissipating fin.

FIG. 1 shows a schematic diagram of the lower cover of the housing for a multifunctional electronic device according to an embodiment of the present invention, wherein A is an overall view, B is an exploded view, 11 represents a second layer, and 12 represents a heat dissipator.

The heat dissipator may be formed of a fourth thermoplastic material with an in-plane thermal conductivity of not less than 0.25 W/(m·K), determined according to ASTM1461-01(2001). Preferably, the heat dissipator is formed of a fourth thermoplastic material with an in-plane thermal conductivity in the range of 4 W/(m·K) to 20 W/(m·K).

The thermoplastic material for forming the heat dissipator may be for example polycarbonate.

Examples of the thermoplastic material for forming the heat dissipator include polycarbonate sold by the company Covestro Polymer (China) under the trade name of Makrolon® TC110FR.

In some embodiments, the lower cover of the housing comprises a second layer formed of a second thermoplastic material with an in-plane thermal conductivity in the range of 0.25 to 1.5 W/(m·K), and a heat dissipator formed of a fourth thermoplastic material with an in-plane thermal conductivity of greater than 4 W/(m·K). This type of lower cover is suitable for heat dissipation of the multifunctional electronic device with a power of 8 to 15 W.

In some embodiments, the lower cover of the housing comprises a second layer and a heat dissipator both formed of a thermoplastic material with an in-plane thermal conductivity in the range of 0.25 to 1.5 W/(m·K). This type of lower cover is suitable for heat dissipation of the multifunctional electronic device with a power of less than 8 W.

The second layer and the heat dissipator may be integrally formed or separately formed and then assembled together.

The upper cover and the lower cover may be fixed together by one or more snap-fits, interference fits, or welding to form an internal space.

The welding can be, for example, ultrasonic welding, vibration welding, thermal welding, or laser welding.

The functional components may be selected from the group consisting of electronic component indicators, a charging port, touch control components, ambient light homogenizers and antennas.

The electronic components may be, for example, WiFi, wireless charging, Bluetooth, radio frequency identification, near field communication tags, transceivers, USB interconnection, microphone, data transmission components, sensors, etc.

The touch control components may be selected from an ambient light switch, a multifunctional electronic device switch and the like.

Figure 2:
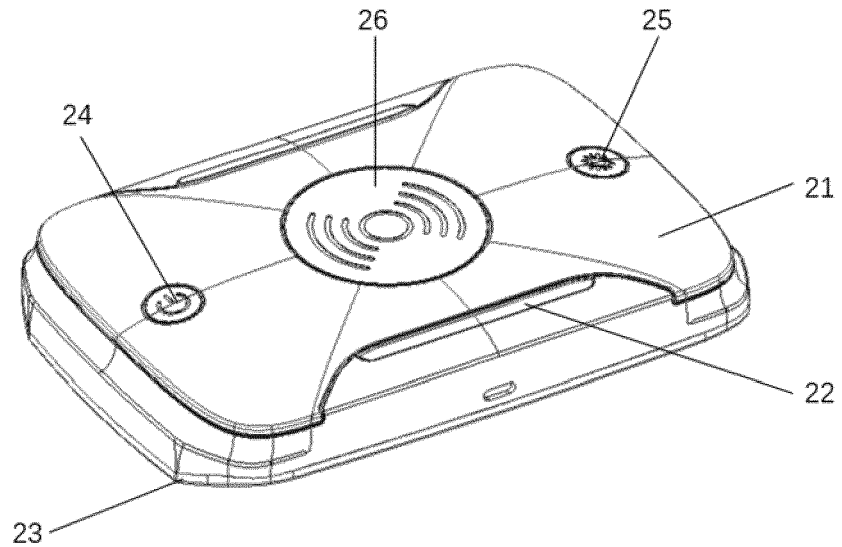
FIG. 2 shows a photo of the housing for a multifunctional electronic device according to an embodiment of the present invention, wherein 21 represents a first layer, 22 represents ambient light homogenizers, 23 represents a second layer, 24 represents a multifunctional electronic device switch, 25 represents an ambient light switch, and 26 represents a wireless charging indicator.

FIG. 2 shows a photo of the housing for a multifunctional electronic device according to an embodiment of the present invention, wherein 21 represents a first layer, 22 represents ambient light homogenizers, 23 represents a second layer, 24 represents a multifunctional electronic device switch, 25 represents an ambient light switch, and 26 represents a wireless charging indicator.

The skilled in the art can select suitable material to prepare the desired functional components.

When ambient light homogenizers are integrated on the upper cover, they may be made of polycarbonate with light diffusion and homogenization effect, for example, Makrolon® 2407 021182 commercially available from the company Covestro Polymer (China).

When antennas are integrated on the upper cover, they may be attached to the inner surface, outer surface, or inner and outer surfaces of the first layer of the upper cover.

When the antennas are 3D conformally integrated on the upper cover, a signal transmission path can be formed by electrical connection between the metal antennas and the inside, thereby shortening the distance for outward heat conduction (the distance is just equal to the wall thickness of 0.8 mm to 1.5 mm), and maximizing the contact area for heat conduction. Meanwhile, heat dissipation can be improved by the ultra-high thermal conductivity (above 100 W/(m·K)) of the metal antennas.

When antennas are integrated on the upper cover, they are suitable for broadband electromagnetic waves (above 800 MHz).

Preferably, components of the housing for a multifunctional electronic device according to the present invention are combined without any adhesive, glue, screw, etc., so that the wastes after use are easily recyclable.

The material used for preparing the housing for a multifunctional electronic device according to the present invention may be up to 75% post-consumer recycled PCR material.

In some embodiments, the thermoplastic material used for preparing the housing for a multifunctional electronic device according to the present invention is a single type of polymer material, which increases the ratio of recycled material, and reduces the difficulty and energy consumption in recycling.

Figure 3:
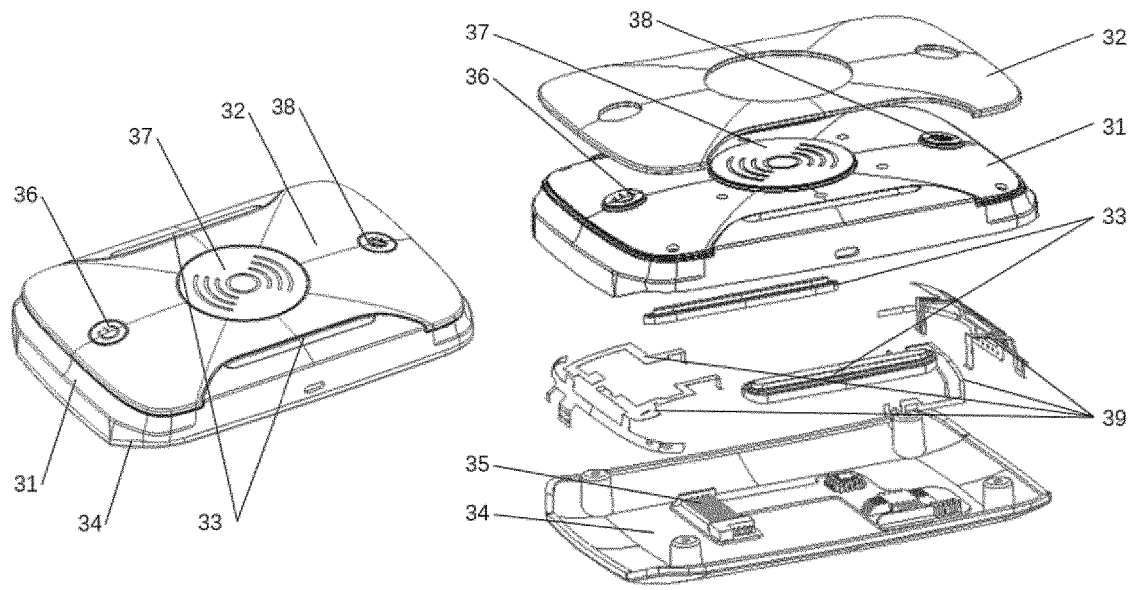
FIG. 3 shows a schematic diagram of the housing for a multifunctional electronic device according to an embodiment of the present invention, wherein A is an overall view, B is an exploded view, 31 represents a first layer, 32 represents a decorative layer, 33 represents ambient light homogenizers, 34 represents a second layer; 35 represents a heat dissipator, 36 represents a multifunctional electronic device switch, 37 represents a wireless charging indicator, 38 represents an ambient light switch, and 39 represents antennas.

FIG. 3 shows a schematic diagram of the housing for a multifunctional electronic device according to an embodiment of the present invention, wherein A is an overall view, B is an exploded view, 31 represents a first layer, 32 represents a decorative layer, 33 represents ambient light homogenizers, 34 represents a second layer; 35 represents a heat dissipator, 36 represents a multifunctional electronic device switch, 37 represents a wireless charging indicator, 38 represents an ambient light switch, and 39 represents antennas.

With some functional components integrated on the inner surface, outer surface or inner and outer surfaces of the upper cover, the multifunctional electronic device of the present invention can free up space for internal design of the product, and increase the distance between the functional components, thereby solving the problem of electromagnetic interference of various electronic functions.

Preferably, compared with the existing housings for a multifunctional electronic device, the housing for a multifunctional electronic device of the present invention achieves 3D conformation of some functional components (such as antennas) and the upper cover by using a polycarbonate material with better and more stable signal penetration capability as a base material, to reduce signal transmission loss.

The housings for a multifunctional electronic device of the present intention may have various sizes.

For example, the housing for a multifunctional electronic device of the present invention may have a size as small as 100 mm×80 mm×20 mm, and integrate at least two functional components at the same time.

Preferably, the housing for a multifunctional electronic device of the present invention have a flame retardant rating of V0, as determined according to UL94-2015.

Moreover, the housing for a multifunctional electronic device of the present invention can pass the 1.3 m free drop test as measured in accordance with IEC60068-2-32-1975.

According to the second aspect, the present invention provides a method for preparing the above housing, comprising:
  i) forming the upper cover comprising the first layer and an optional decorative layer, and integrating the functional components to the first layer;
  ii) forming the lower cover comprising the second layer and an optional heat dissipator; and
  iii) optionally, fixing the upper cover together with the lower cover to form an internal space.

A person skilled in the art can understand that optionally the upper cover or the lower cover is formed at first.

The first layer and the decorative layer (if any) of the upper cover, the second layer and the heat dissipator (if any) of the lower cover may be processed by a molding process known in the art for the thermoplastic material (for example, traditional injection molding process, two-shot injection molding process, overmolding, rapid heating and rapid cooling molding process, etc.)

A person skilled in the art can select the appropriate process conditions according to the thermoplastic material used to prepare the first layer and the decorative layer (if any) of the upper cover, the second layer and the heat dissipator (if any) of the lower cover.

The first layer and the decorative layer (if any) of the upper cover, and the second layer of the lower cover formed of the thermoplastic material (especially polycarbonate) have good surface quality, require no painting, electroplating or coating, simplifies steps in the manufacturing process, shortens the preparation cycle, and reduces environmental pollution.

The functional components can be integrated to the upper cover through, for example, laser activating plating (LAP), laser direct structuring (LDS), 3D printing or injection molding.

For example, when there are electronic component indicators, charging ports and/or touch control components to be integrated to the upper cover, they can be integrated to the first layer by being molded together with the first layer.

For example, when there are antennas to be integrated to the upper cover, they can be 3D conformally attached to the inner surface, outer surface, or inner and outer surfaces of the first layer of the upper cover.

For example, when there are ambient light homogenizers to be integrated to the upper cover, they can be integrated on the first layer of the upper cover through welding, overmolding or two-shot molding, wherein the welding may be selected from ultrasonic welding, vibration welding, thermal welding and laser welding.

When the lower cover comprises a heat dissipator, the heat dissipator may be combined with the second layer through two-shot molding or overmolding.

As noted before, the upper cover and the lower cover may be fixed together by one or more snap-fits, interference fits or welding to form an internal space.

Preferably, the welding is selected from ultrasonic welding, vibration welding, thermal welding, and laser welding.

According to the third aspect, the present invention provides a multifunctional electronic device, comprising the above housing.

In some embodiments, the multifunctional electronic device further comprises a printed circuit board (PCB) and a WiFi module.

The PCB comprise circuits and chips that can fulfill expected electronic functions.

The PCB and the WiFi module are commercially available.

Figure 4:
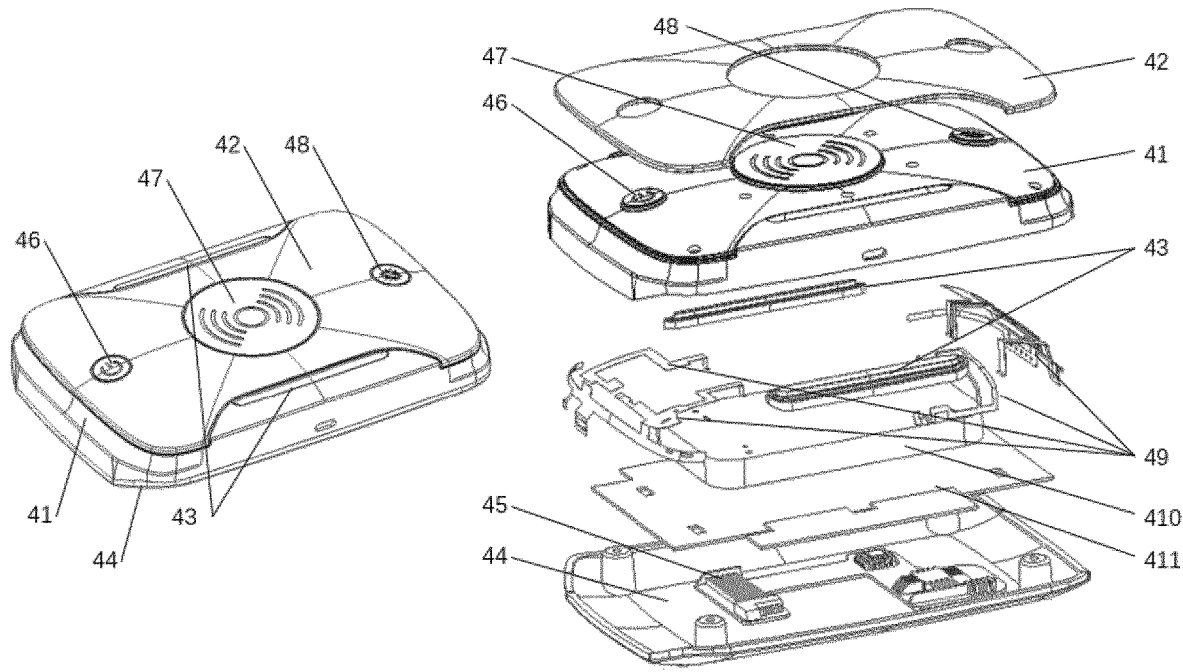
FIG. 4 shows a schematic diagram of a multifunctional electronic device according to an embodiment of the present invention, wherein A is an overall view, B is an exploded view, 41 represents a first layer, 42 represents a decorative layer, 43 represents ambient light homogenizers, 44 represents a second layer; 45 represents a heat dissipator, 46 represents a multifunctional electronic device switch, 47 represents a wireless charging indicator, 48 represents an ambient light switch, 49 represents antennas, 410 represents a WiFi module, and 411 represents a printed circuit board (PCB) assembly.

FIG. 4 shows a schematic diagram of a multifunctional electronic device according to an embodiment of the present invention, wherein A is an overall view, B is an exploded view, 41 represents a first layer, 42 represents a decorative layer, 43 represents ambient light homogenizers, 44 represents a second layer; 45 represents a heat dissipator, 46 represents a multifunctional electronic device switch, 47 represents a wireless charging indicator, 48 represents an ambient light switch, 49 represents antennas, 410 represents a WiFi module, and 411 represents a printed circuit board (PCB).

With some functional components integrated on the inner surface, outer surface, or inner and outer surfaces of the upper cover, the housing for multifunctional electronic device of the present invention can free up space for internal design of the product, and increase the distance between the functional components, thereby solving the problem of electromagnetic interference of various electronic functions.

Compared with the existing multifunctional electronic device, the multifunctional electronic device of the present invention reduces signal transmission loss by using a polycarbonate material with better and more stable signal penetration capability as a base material to realize 3D conformation between some functional components (such as antennas) and the upper cover.

The description of each feature in the present application may be combined with each other without mutual contradiction, and falls within the scope as claimed in the present application.

The terms "comprising" and "including" in the present application cover the circumstances which further comprise or include other elements not specifically mentioned and the circumstances consisting of the elements mentioned.

Unless otherwise defined, all technical and scientific terms used herein have the same meaning as commonly understood by a person skilled in the field the present invention belongs to. When the definition of a term in the present description conflicts with the meaning as commonly understood by a person skilled in the field the present invention belongs to, the definition described herein shall apply.

This invention particularly refers to the following aspects:
1. A housing for a multifunctional electronic device, comprising:
   an upper cover comprising a first layer 21, 31, 41, 51, 61 formed of a first thermoplastic material with an in-plane thermal conductivity of less than 1.5 W/(m·K), a relative dielectric constant (Dk) of less than 5.0, and a surface resistance of greater than $10^{11}\Omega$, wherein the first layer 21, 31, 41, 51, 61 has a thickness in the range of 0.8 mm to 1.5 mm, and wherein at least two functional components are integrated to the first layer 21, 31, 41, 51, 61; and
   a lower cover, which is fixed together with the upper cover to form an internal space, comprising a second layer 11, 23, 34, 44, 57, 68 formed of a second thermoplastic material with an in-plane thermal conductivity in the range of 0.25 W/(m·K) to 1.5 W/(m·K), wherein the second layer 11, 23, 34, 44, 57, 68 has a thickness in the range of 2 mm to 4 mm;
   wherein
   the housing comprises at least 90 wt % of the thermoplastic materials, relative to the total weight of the housing;
   the upper cover has a flame retardant rating of HB or above, as determined according to UL94-2015,
   the in-plane thermal conductivity is determined according to ASTM1461-01(2001),
   the relative dielectric constant is determined according to IEC61189-2-721:2015 with the SPDR (split postdielectric resonator) method at a frequency of 5.0 GHz,
   the surface resistance is determined according to ISO3915-1999.
2. The housing according to aspect 1, wherein the upper cover further comprises a decorative layer 32, 42, 62 disposed on the outer surface of the first layer 21, 31, 41, 51, 61 and at least partially covering the first layer 21, 31, 41, 51, 61, said decorative layer 32, 42, 62 being formed of a third thermoplastic material with an in-plane thermal conductivity of less than 0.25 W/(m·K), a relative dielectric constant (Dk) of less than 5.0, and surface resistance of greater than $10^{11}\Omega$, and having a thickness in the range of 0.8 mm to 1.2 mm,
   wherein
   the in-plane thermal conductivity is determined according to ASTM1461-01(2001),
   the relative dielectric constant is determined according to IEC61189-2-721:2015 with the SPDR (split postdielectric resonator) method at a frequency of 5.0 GHz,
   the surface resistance is determined according to ISO3915-1999.
3. The housing according to aspect 1 or 2, wherein the thermoplastic material for forming the first layer 21, 31, 41, 51, 61 is selected from polycarbonate or a polycarbonate/acrylonitrile-butadiene-styrene (PC/ABS) blend.
4. The housing according to aspect 2 or 3, wherein the thermoplastic material for forming the decorative layer 32, 42, 62 is selected from polycarbonate or a polycarbonate/acrylonitrile-butadiene-styrene (PC/ABS) blend.
5. The housing according to any of aspects 1-4, wherein the thermoplastic material for forming the second layer 11, 23, 34, 44, 57, 68 is polycarbonate.
6. The housing according to any of aspects 1-5, wherein the lower cover further comprises a heat dissipator 12, 35, 45, 58 disposed on the inner surface of the second layer 11, 23, 34, 44, 57, 68 which at least partially covers the second layer 11, 23, 34, 44, 57, 68.
7. The housing according to aspect 6, wherein the heat dissipator 12, 35, 45, 58 is formed of a fourth thermoplastic material with an in-plane thermal conductivity of not less than 0.25 W//(m·K), determined according to ASTM1461-01(2001), and preferably, the heat dissipator 12, 35, 45, 58 is formed of a fourth thermoplastic material with an in-plane thermal conductivity in the range of 4.0 W/(m·K) to 20.0 W/(m·K), determined according to ASTM1461-01(2001).
8. The housing according to aspect 6 or 7, wherein the thermoplastic material for forming the heat dissipator 12, 35, 45, 58 is polycarbonate.
9. The housing according to any of aspects 1-8, wherein the upper cover and the lower cover are fixed together by snap-fit, an interference fit or welding.
10. The housing according to aspect 9, wherein the welding is selected from ultrasonic welding, vibration welding, thermal welding and laser welding.
11. The housing according to any of aspects 1-10, wherein the functional components are selected from the group consisting of electronic component indicators, a charging port, touch control components, ambient light homogenizers 22, 33, 43, 52, 63 and antennas 39, 49, 56, 67.
12. The housing according to aspect 11, wherein the touch control components are selected from an ambient light 25, 38, 48, 54, 65 switch and a multifunctional electronic device switch 24, 36, 46, 53, 64.
13. The housing according to aspect 11, wherein there are one or more antennas 39, 49, 56, 67 integrated to the upper cover, and the antennas 39, 49, 56, 67 are attached to the inner surface, outer surface, or inner and outer surfaces of the first layer 21, 31, 41, 51, 61 of the upper cover.
14. A method for preparing the housing according to any of aspects 1-13, comprising:
i) forming the upper cover comprising the first layer 21, 31, 41, 51, 61 and an optional decorative layer 32, 42, 62, and integrating the functional components to the first layer 21, 31, 41, 51, 61;
ii) forming the lower cover comprising the second layer 11, 23, 34, 44, 57, 68 and an optional heat dissipator 12, 35, 45, 58; and
iii) fixing the upper cover together with the lower cover to form an internal space.
15. A multifunctional electronic device, comprising a housing according to any of aspects 1-13.

EXAMPLES

The concept, the specific structure and the resulting technical effects of the present invention will be further illustrated below in conjunction with the Examples so that a person skilled in the art can fully understand the objectives, features and effects of the present invention. The skilled person in the art will understand that the Examples herein are for illustrative purposes only and the scope of the present invention is not limited thereto.

Equipment

Injection molding machine: KraussMaffei CXL110-380/180 type two-shot molding machine.

Raw Materials

Polycarbonate 1: Polycarbonate sold by the company Covestro Polymers (China) under the trade name of Makrolon® FR6005 HF.

Polycarbonate 2: Translucent polycarbonate sold by the company Covestro Polymers (China) under the trade name of Makrolon® 2407 021182, with a transmittance of 57% for a visible light with a wavelength of 390-780 nm and a half-power angle of 49.6 degrees, as measured in accordance with ISO 13468-2 (1999) at a thickness of 2 mm.

Polycarbonate 3: Polycarbonate with a high thermal conductivity sold by the company Covestro Polymers (China) under the trade name of Makrolon® TC611.

Polycarbonate 4: Polycarbonate with a low thermal conductivity sold by the company Covestro Polymers (China) under the trade name of Makrolon® TC110FR.

The trade names and some performance indexes of the above polycarbonates are illustrated in Table 1.

TABLE 1

| | Polycarbonate 1 | Polycarbonate 2 | Polycarbonate 3 | Polycarbonate 4 |
|---|---|---|---|---|
| Trade Names | Makrolon® FR6005HF | Makrolon® 2407 021182 | Makrolon® TC611 | Makrolon® TC110FR |
| Relative dielectric constant (Dk)/dielectric loss tangent (Df) | 2.82/0.005 | 2.78/0.005 | — | 3.25/0.005 |
| Impact strength Izod (KJ/m$^2$) Notched | 60 | 65 | — | — |
| Impact strength Izod (KJ/m$^2$) Unnotched | — | — | <10 | 90 |
| Flame retardant rating | V0@1.5 mm | V2@0.75 mm | V0@2.0 mm | HB |
| In-plane thermal conductivity (W/(m · K)) | <0.2 | <0.2 | 16 | 0.8 |
| Surface resistance (Ω) | >E$^{15}$ | >E$^{15}$ | — | >E$^{15}$ |
| Melt index (cm$^3$/min) | 15 | 19 | — | 5 |

The impact strength was determined at 23° C. according to ISO 180-A.

The melting index was determined at 300° C. and 1.2 kg according to ISO1133.

The relative dielectric constant (Dk)/dielectric loss tangent (DI) was determined according to IEC61189-2-721: 2015 with the SPDR (split postdielectric resonator) method at a frequency of 5.0 GHz.

The in-plane thermal conductivity was determined according to ASTM1461-01(2001).

The surface resistance was determined according to ISO3915-1999.

Example 1

Figure 5:
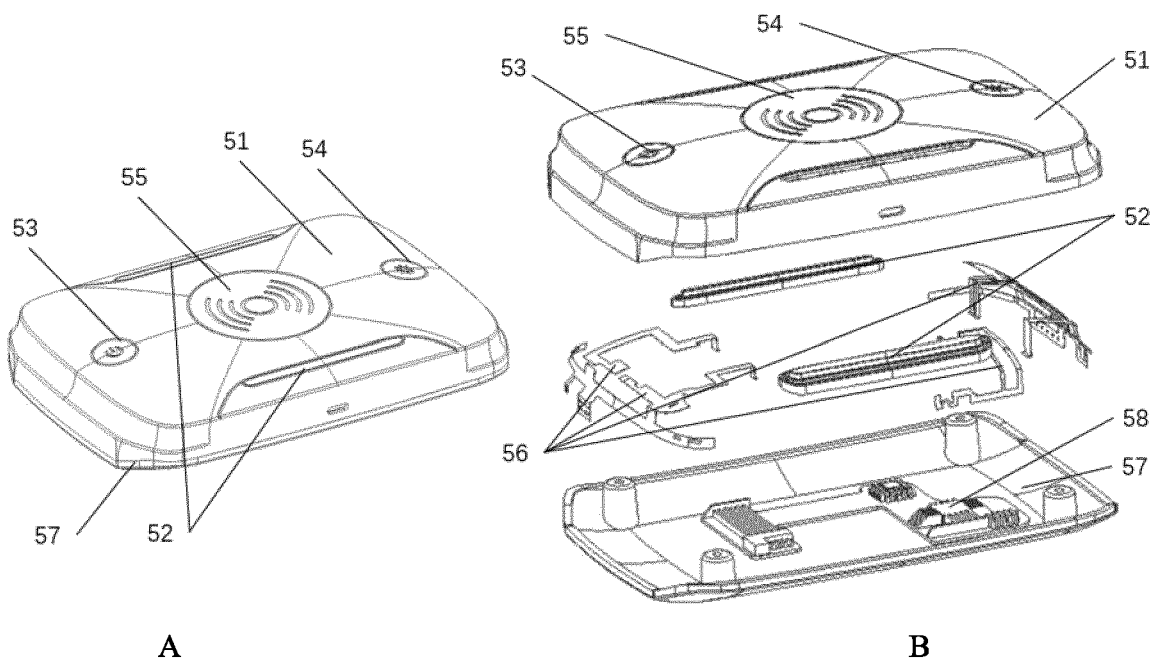
FIG. 5 shows a schematic diagram of the housing for a multifunctional electronic device prepared in Example 1, wherein A is an overall view, B is an exploded view, 51 represents a first layer, 52 represents ambient light homogenizers, 53 represents a multifunctional electronic device switch, 54 represents an ambient light switch, 55 represents a wireless charging indicator, 56 represents antennas, 57 represents a second layer, and 58 represents a heat dissipator.

Referring to FIG. 5, a housing for a multifunctional electronic device comprises:
an upper cover comprising a first layer 51 formed of polycarbonate Makrolon® FR6005 HF (polycarbonate 1), wherein the first layer 51 has a thickness of 1.5 mm and comprises ambient light homogenizers 52 formed of polycarbonate Makrolon® 2407 021182 (polycarbonate 2), a multifunctional electronic device switch 53, an ambient light switch 54, a wireless charging indicator 55 and antennas 56 integrated thereon and snip fits (not shown); and a lower cover comprising a second layer 57 formed of polycarbonate Makrolon® TC110FR (polycarbonate 4) and a heat dissipator 58 formed of polycarbonate Makrolon® TC611 (polycarbonate 3), wherein the second layer 57 has a thickness of 2 mm and snip fits (not shown), and the heat dissipator 58 is configured as a heat dissipating rib, covering about 40% area of the inner surface of the second layer 57;

wherein the upper cover and the lower cover are fixed together by the snip fits (not shown) on the first layer 51 and the snip fits (not shown) on the second layer 57 to form an internal space, wherein the housing comprises at least 90 wt % of the thermoplastic materials, relative to the total weight of the housing, wherein the upper cover has a flame retardant rating of V0 as determined according to UL94-2015.

The upper cover was prepared by:

forming a first layer comprising a multifunctional electronic device switch, an ambience light switch, a wireless charging indicator and snip fits by injection molding using polycarbonate Makrolon® FR6005 HF (polycarbonate 1);

forming ambient light homogenizers by injection molding using translucent material Makrolon® 2407 021182 (polycarbonate 2), and then assembling the ambient light homogenizers with the first layer of the upper cover through laser welding; and forming 3D conformal antennas on the inner surface of the first layer through laser activating plating (LAP).

The lower cover was prepared by:

forming a second layer by injection molding using polycarbonate Makrolon® TC110FR (polycarbonate 4);

forming a heat dissipator by two-color injection molding using polycarbonate Makrolon® TC611 (polycarbonate 3).

The conditions for molding the first layer, the second layer and the heat dissipator are illustrated in Table 2.

TABLE 2

| Components | Materials | Drying Conditions | Mold Temperature | Material Temperature |
|---|---|---|---|---|
| First layer of the upper cover | Makrolon ® FR6005HF | 120° C./4 h | 80° C. | 280° C. |
| Ambient light homogenizers | Makrolon ® 2407 021182 | 120° C./4 h | 80° C. | 300° C. |
| Second layer of the lower cover | Makrolon ®TC110FR | 120° C./4 h | 90° C. | 300° C. |
| Heat dissipator | Makrolon ®TC611 | 110° C./4 h | 80° C. | 310° C. |

The conditions for forming the antennas are as follows:

A 1064 nm laser engraving machine was used to engrave the shape of antennas on the inner surface of the upper cover with the laser engraving parameters of 8 W, 60 KHz and 3,000 m/s. Then, a metal copper-nickel layer was deposited by the electroless plating process through roughening, activation and reduction. The antennas were 3D conformally integrated on the inner surface of the upper cover.

After preparation of the upper cover and the lower cover, the WiFi functional module and PCB were fixed onto the upper cover through the snap fits on the first layer. Then, the upper cover and the lower cover were fixed together by the snap fits on the first layer and the snap fits on the second layer to obtain a multifunctional electronic device with a power of 8 to 15 W.

The prepared multifunctional electronic device had a signal penetration ratio of 96%, and achieved thermal equilibrium after 20 minutes of operation, with the surface temperature of the housing being less than 60° C., and the chip temperature of PCB being less than 110° C.

Example 2

Figure 6:
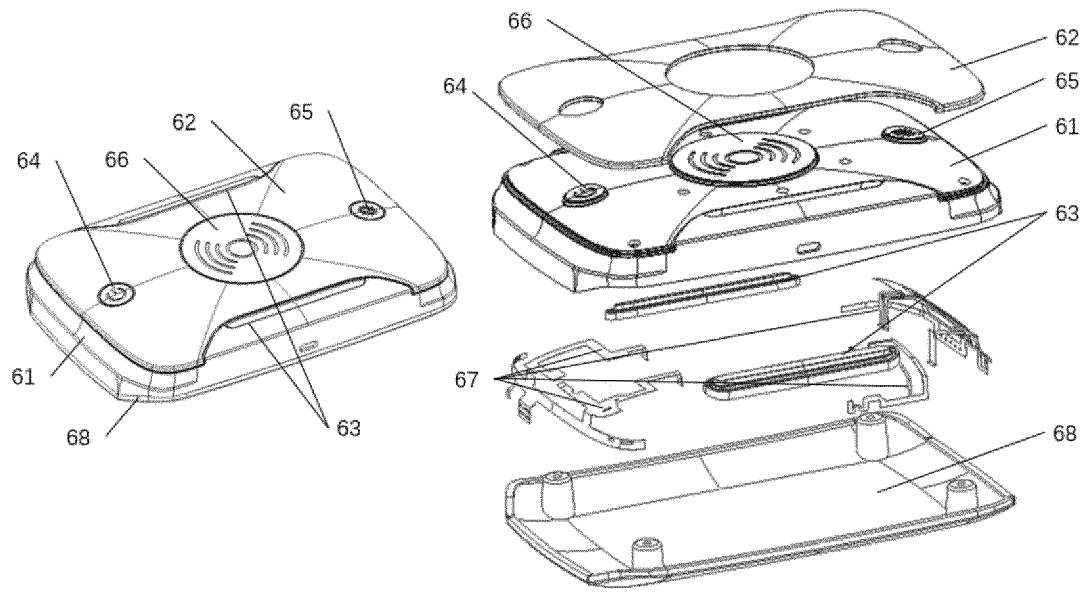
FIG. 6 shows a schematic diagram of the housing for a multifunctional electronic device prepared in Example 2, wherein A is an overall view, B is an exploded view, 61 represents a first layer, 62 represents a decorative layer, 63 represents ambient light homogenizers, 64 represents a multifunctional electronic device switch, 65 represents an ambient light switch, 66 represents a wireless charging indicator, 67 represents antennas, and 68 represents a second layer.

Referring to FIG. 6, a housing for a multifunctional electronic device comprises:

an upper cover comprising a first layer 61 and a decorative layer 62 formed of polycarbonate Makrolon® FR6005 HF (polycarbonate 1), wherein the first layer 61 has a thickness of 1.2 mm and comprises ambient light homogenizers 63 formed of polycarbonate Makrolon® 2407 021182 (polycarbonate 2), a multifunctional electronic device switch 64, an ambient light switch 65, a wireless charging indicator 66 and antennas 67 integrated thereon and snap fits (not shown), and the decorative layer has a thickness of 1 mm; and a lower cover comprising a second layer 68 formed of polycarbonate Makrolon® TC110FR (polycarbonate 4), wherein the second layer 68 has a thickness of 2 mm and snip fits (not shown);

wherein the upper cover and the lower cover are fixed together by the snip fits on the first layer 61 and the snip fits on the second layer 68 to form an internal space, wherein the housing comprises at least 90 wt % of the thermoplastic materials, relative to the total weight of the housing, wherein the upper cover has a flame retardant rating of V0 as determined according to UL94-2015.

The upper cover was prepared by:

forming a first layer and a decorative layer by injection molding using polycarbonate Makrolon® FR6005 HF (polycarbonate 1), wherein the first layer comprises a multifunctional electronic device switch, an ambience light switch, a wireless charging indicator and snip fits;

forming ambient light homogenizers by injection molding using translucent material Makrolon® 2407 021182 (polycarbonate 2), and then assembling the ambient light homogenizers with the first layer through laser welding; and forming 3D conformal antennas on the inner surface of the first layer through laser activating plating (LAP).

The lower cover was formed by injection molding with polycarbonate Makrolon®TC110FR (polycarbonate 4).

The conditions for molding the first layer, the decorative layer, ambient light homogenizers, and the lower cover are illustrated in Table 3.

TABLE 3

| Components | Materials | Drying Conditions | Mold Temperature | Material Temperature |
|---|---|---|---|---|
| First layer of the upper cover | Makrolon ®FR6005HF | 120° C./4 h | 80° C. | 280° C. |
| the decorative layer | Makrolon ®FR6005HF | 120° C./4 h | 80° C. | 280° C. |
| Ambient light homogenizers | Makrolon ®2407 021182 | 120° C./4 h | 80° C. | 300° C. |
| The lower layer | Makrolon ®TC110FR | 120° C./4 h | 90° C. | 300° C. |

The conditions for forming the antennas are as follows:

A 1064 nm laser engraving machine was used to engrave the shape of antennas on the inner surface of the upper cover with the laser engraving parameters of 8 W, 60 KHz and 3,000 m/s. Then, a metal copper-nickel layer was deposited by the electroless plating process through roughening, activation and reduction. The antennas were 3D conformally integrated on the inner surface of the upper cover.

After preparation of the upper cover and the lower cover, the WiFi functional module and PCB were fixed onto the upper cover through the snip fits on the first layer. Then, the upper cover and the lower cover were fixed together by the snap fits on the first layer and the snip fits on the second layer to obtain a multifunctional electronic device with a power of less than 8 W.

The prepared multifunctional electronic device had a signal penetration ratio of 96%, and achieved thermal equilibrium after 20 minutes of operation, with the surface temperature of the housing being less than 40° C., and the chip temperature of PCB being less than 70° C.

LIST OF REFERENCE NUMBERS

11: second layer
12: heat dissipator
21: first layer
22: ambient light homogenizers
23: second layer
24: multifunctional electronic device switch
25: ambient light switch
26: wireless charging indicator
31: first layer
32: decorative layer
33: ambient light homogenizers
34: second layer
35: heat dissipator
36: multifunctional electronic device switch
37: wireless charging indicator
38: ambient light switch
39: antenna(s)
41: first layer
42: decorative layer
43: ambient light homogenizers
44: second layer
45: heat dissipator
46: multifunctional electronic device switch
47: wireless charging indicator
48: ambient light switch
49: antenna(s)
410: WiFi module
411: printed circuit board (PCB) assembly
51: first layer
52: ambient light homogenizers
53: multifunctional electronic device switch
54: ambient light switch
55: wireless charging indicator
56: antenna(s)
57: second layer
58: heat dissipator
61: first layer
62: decorative layer
63: ambient light homogenizers
64: multifunctional electronic device switch
64: ambient light switch
66: wireless charging indicator
67: antenna(s)
68: second layer

The invention claimed is:

1. A housing for a multifunctional electronic device, comprising:
   an upper cover comprising a first layer (21, 31, 41, 51, 61) formed of a first thermoplastic material with an in-plane thermal conductivity of less than 1.5 W/(m·K), a relative dielectric constant (Dk) of less than 5.0, and a surface resistance of greater than $10^{11}\Omega$, wherein the first layer (21, 31, 41, 51, 61) has a thickness in the range of 0.8 mm to 1.5 mm, and wherein at least two functional components are integrated to the first layer (21, 31, 41, 51, 61); and
   a lower cover, which is fixed together with the upper cover to form an internal space, comprising a second layer (11, 23, 34, 44, 57, 68) formed of a second thermoplastic material with an in-plane thermal conductivity in the range of 0.25 W/(m·K) to 1.5 W/(m·K), wherein the second layer (11, 23, 34, 44, 57, 68) has a thickness in the range of 2 mm to 4 mm;
   wherein
   the housing comprises at least 90 wt % of the thermoplastic materials, relative to the total weight of the housing;
   the upper cover has a flame retardant rating of HB or above, as determined according to UL94-2015,
   the in-plane thermal conductivity is determined according to ASTM1461-01(2001),
   the relative dielectric constant is determined according to IEC61189-2-721:2015 with the SPDR (split postdielectric resonator) method at a frequency of 5.0 GHz,
   the surface resistance is determined according to ISO3915-1999.

2. The housing according to claim 1, wherein the upper cover further comprises a decorative layer (32, 42, 62) disposed on the outer surface of the first layer (21, 31, 41, 51, 61) and at least partially covering the first layer (21, 31, 41, 51, 61), said decorative layer (32, 42, 62) being formed of a third thermoplastic material with an in-plane thermal conductivity of less than 0.25 W/(m·K), a relative dielectric constant (Dk) of less than 5.0, and surface resistance of greater than $10^{11}\Omega$, and having a thickness in the range of 0.8 mm to 1.2 mm, wherein the in-plane thermal conductivity is determined according to ASTM1461-01(2001), the relative dielectric constant is determined according to IEC61189-2-721:2015 with the SPDR (split postdielectric resonator) method at a frequency of 5.0 GHz, the surface resistance is determined according to ISO3915-1999.

3. The housing according to claim 2, wherein the thermoplastic material for forming the decorative layer (32, 42, 62) is selected from polycarbonate or a polycarbonate/acrylonitrile-butadiene-styrene (PC/ABS) blend.

4. The housing according to claim 1, wherein the thermoplastic material for forming the first layer (21, 31, 41, 51, 61) is selected from polycarbonate or a polycarbonate/acrylonitrile-butadiene-styrene (PC/ABS) blend.

5. The housing according to claim 1, wherein the thermoplastic material for forming the second layer (11, 23, 34, 44, 57, 68) is polycarbonate.

6. The housing according to claim 1, wherein the lower cover further comprises a heat dissipator (12, 35, 45, 58) disposed on the inner surface of the second layer (11, 23, 34, 44, 57, 68) which at least partially covers the second layer (11, 23, 34, 44, 57, 68).

7. The housing according to claim 6, wherein the heat dissipator (12, 35, 45, 58) is formed of a fourth thermoplastic material with an in-plane thermal conductivity of not less than 0.25 W//(m·K), determined according to ASTM1461-01(2001).

8. The housing according to claim 6, wherein the thermoplastic material for forming the heat dissipator (12, 35, 45, 58) is polycarbonate.

9. The housing according to claim 1, wherein the upper cover and the lower cover are fixed together by snap-fit, an interference fit or welding.

10. The housing according to claim 9, wherein the welding is selected from ultrasonic welding, vibration welding, thermal welding and laser welding.

11. The housing according to claim 1, wherein the functional components are selected from the group consisting of electronic component indicators, a charging port, touch control components, ambient light homogenizers (22, 33, 43, 52, 63) and antennas (39, 49, 56, 67).

12. The housing according to claim 11, wherein the touch control components are selected from an ambient light switch (25, 38, 48, 54, 65) and a multifunctional electronic device switch (24, 36, 46, 53, 64).

13. The housing according to claim 11, wherein there are one or more antennas (39, 49, 56, 67) integrated to the upper cover, and the antennas (39, 49, 56, 67) are attached to the inner surface, outer surface, or inner and outer surfaces of the first layer (21, 31, 41, 51, 61) of the upper cover.

14. A method for preparing the housing according to claim 1, comprising:

i) forming the upper cover comprising the first layer (21, 31, 41, 51, 61) and an optional decorative layer (32, 42, 62), and integrating the functional components to the first layer (21, 31, 41, 51, 61);

ii) forming the lower cover comprising the second layer (11, 23, 34, 44, 57, 68) and an optional heat dissipator (12, 35, 45, 58); and iii) fixing the upper cover together with the lower cover to form the internal space.

15. A multifunctional electronic device, comprising a housing according to claim 1.

* * * * *